United States Patent
Yamagami et al.

(10) Patent No.: US 7,357,681 B2
(45) Date of Patent: Apr. 15, 2008

(54) ELECTRICAL CONNECTOR

(75) Inventors: Hidehisa Yamagami, Kanagawa (JP);
Ken Furuyama, Kanagawa (JP);
Atsushi Nishida, Aichi (JP); Masato Minakata, Aichi (JP); Hiroshi Kobayashi, Aichi (JP)

(73) Assignee: Tyco Electronics AMP K.K., Kanagawa-Ken (JP)

( * ) Notice: Subject to any disclaimer, the term of this patent is extended or adjusted under 35 U.S.C. 154(b) by 0 days.

(21) Appl. No.: 11/187,295

(22) Filed: Jul. 22, 2005

(65) Prior Publication Data
US 2006/0025024 A1 Feb. 2, 2006

(30) Foreign Application Priority Data
Jul. 30, 2004 (JP) .............................. 2004-223418

(51) Int. Cl.
*H01R 9/24* (2006.01)
(52) U.S. Cl. ...................................... 439/886
(58) Field of Classification Search ........ 439/885–887; 29/885
See application file for complete search history.

(56) References Cited

U.S. PATENT DOCUMENTS

| 5,032,421 | A | * | 7/1991 | Sarma et al. | ................. 427/535 |
| 5,190,486 | A | * | 3/1993 | Tsuk | ........................... 439/886 |
| 5,667,393 | A | * | 9/1997 | Grabbe et al. | ............... 600/443 |
| 6,162,089 | A | * | 12/2000 | Costello et al. | ........... 439/541.5 |
| 2001/0018299 | A1 | | 8/2001 | Lin | |
| 2003/0025182 | A1 | | 2/2003 | Abys et al. | |
| 2004/0116004 | A1 | * | 6/2004 | Kojima | ........................ 439/886 |
| 2006/0025024 | A1 | * | 2/2006 | Yamagami et al. | .......... 439/886 |

FOREIGN PATENT DOCUMENTS

| EP | 0147039 | 7/1985 |
| JP | 11214050 | 8/1999 |
| JP | 2001043919 | 2/2001 |
| JP | 3538747 | 4/2004 |

OTHER PUBLICATIONS

Mr. M. Osterman, Mitigation Strategies for Tin Whiskers, Jul. 3, 2002, Release 1.0, pp. 6 and 7.*

* cited by examiner

*Primary Examiner*—James R. Harvey
(74) *Attorney, Agent, or Firm*—Barley Snyder LLC

(57) ABSTRACT

A board-mount electrical connector capable of maintaining favorable solderability of a connecting section of a terminal for a long term and preventing occurrence of a whisker in a bent section of the terminal is provided. The electrical connector includes a plurality of terminals each having at one end a contact section which contacts a mating contact and having, at the other end, a connecting section which connects to a circuit board. A bent section is located in a middle portion between the contact section and the connecting section. An insulating housing holds the plurality of terminals. On each terminal, a bright tin-plated layer and a semi-bright tin plated layer are formed on respective surfaces of the contact section and the connecting section leaving the surface of the middle portion unplated by tin such that the semi-bright tin-plated layer is thicker than the bright tin-plated layer.

3 Claims, 1 Drawing Sheet

ELECTRICAL CONNECTOR

FIELD OF THE INVENTION

The present invention relates to an electrical connector including terminals each having a selectively plated contact section that contacts a mating contact at one end and having a selectively plated connecting section which connects to a circuit board at the other end.

BACKGROUND

Conventionally, a board-mount electrical connector having plural terminals, and a housing which holds these terminals is described, for example, in Japanese Patent No. 3538747. Here, in the electrical connector shown in Japanese Patent No. 3538747, each terminal has at one end a male contact section which extends substantially parallel with the circuit board in the housing. The male contact section is inserted into a female contact of a mating connector, and has at the other end a connecting section which extends in a direction substantially perpendicular to the circuit board outside the housing which is soldered to the circuit board. A portion between the contact section and the connecting section is formed to bend behind a rear wall of the housing to reach the connecting section.

For each terminal, tin-plating is applied to the entire terminal from the contact section to the connecting section, and a relatively thick tin-plated layer is formed on the connecting section which is soldered to the circuit board for the following reason. For the terminal of the electrical connector, a copper alloy including zinc is used as a base material, and when tin-plating is applied to such a base material, in time, an alloying phenomenon of tin and zinc which is precipitated inside the tin-plated layer from the base material advances in the tin-plated layer from the base material side to the surface. Here, if the storage time of the electrical connector is too long and the alloying phenomenon reaches the surface of the tin-plated layer, the alloy of tin and zinc appears on the surface. This alloy prevents affinity of the connecting section and solder at the time of soldering, and reduces solderability of the connecting section. Therefore, a relatively thick tin-plated layer is formed on the connecting section, and the allowable time before the alloying phenomenon reaches the surface of the tin-plated layer is made longer, so that favorable solderability of the connecting section can be maintained for a long term.

However, in the terminal of the electrical connector, internal stress remains at a bent portion between the contact section and the connecting section, and there is a possibility that an electrically conductive needle crystal called "a whisker" that grows with time occurs on the tin-plated surface of the terminal due to such internal stress. If such a whisker occurs on the terminal of the electrical connector, there arises the problem that, for example, the whisker electrically short-circuits the adjacent terminals and the like.

SUMMARY

The present invention has been made in view of the above circumstances and provides a board-mount electrical connector which is capable of maintaining favorable solderability of a connecting section of a terminal for a long term, and preventing occurrence of a whisker in a bent section of the terminal.

An electrical connector of the present invention includes terminals each having at one end a contact section which contacts a mating contact and having, at the other end, a connecting section which connects to a circuit board. Each contact also has a bent section in a middle portion between the contact section and the connecting section. A housing holds the terminals. The terminals have tin plating selectively applied to the contact section and to the connecting section such that the connecting section has a thicker tin-plated layer than the contact section.

DETAILED DESCRIPTION OF THE EMBODIMENT(S)

Hereinafter, an embodiment of the present invention will be described with reference to the drawings.

Figure 1:
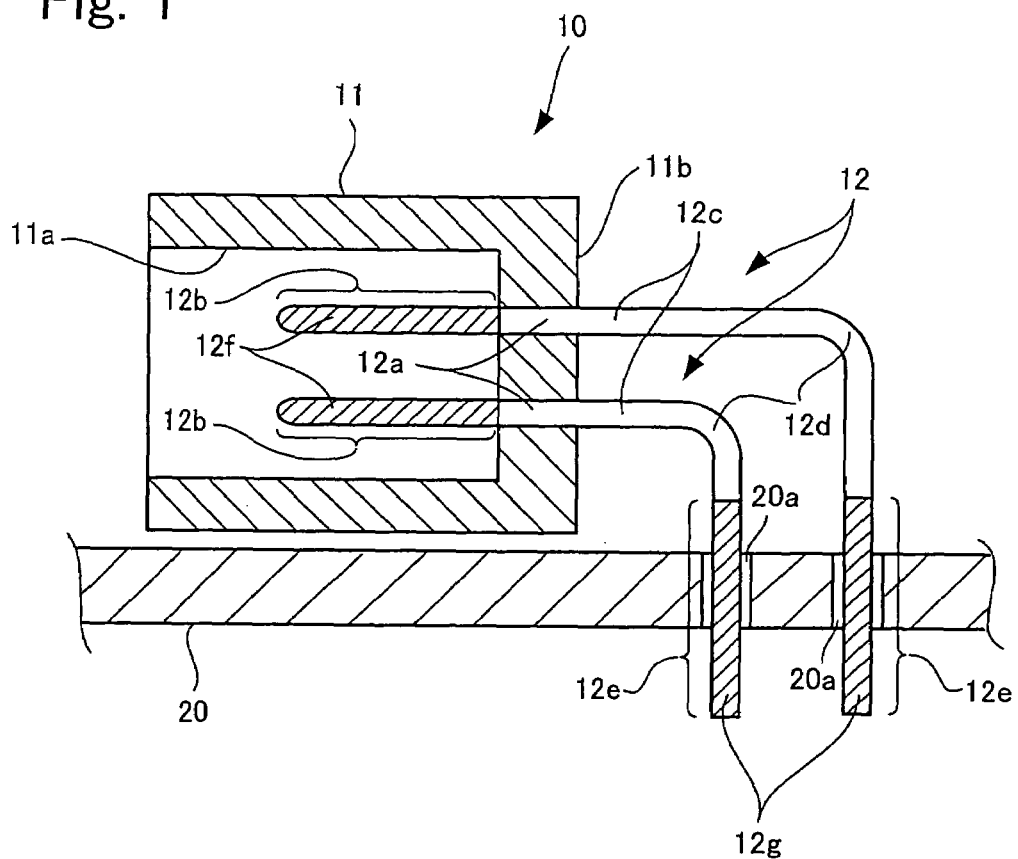
FIG. 1 is a sectional view showing one embodiment of an electrical connector of the present invention.

A connector 10 shown in the embodiment of FIG. 1 has an insulating housing 11 fixed to a circuit board 20 by a mounting section (not shown), and contacts 12 held by the insulating housing 11. The insulating housing 11 has a connector receiving opening 11a in which a mating connector (not shown) may be inserted. Contacts 12 are held and are arranged in a direction perpendicular to the space of the drawing in two rows.

Each contact 12 has an engaging portion 12a, a male contact section 12b, an extended section 12c, a bent section 12d, and a connecting section 12e. The engaging portion 12a is held by a rear wall 11b of the insulating housing 11. The male contact section 12b linearly extends into the insulating housing 11 from the engaging portion 12a and is insertable into a mating female contact (not shown) to electrically connect the two. The extended section 12c linearly extends outside the insulating housing 11 from the engaging portion 12a. The bent section 12d connects to the extended section 12c. The connecting section 12e extends down substantially orthogonally to the circuit board 20 from the bent section 12d, passes through a through-hole 20a of the circuit board 20 and is connected to the circuit board 20 by soldering with solder which optionally does not include lead, such as a tin-copper solder, for example. The combination of the engaging portion 12a, the extended section 12c and the bent section 12d form a middle portion. It should be understood that the shape of the bent section 12d may be in any shape irrespective of the dimension of a radius of curvature, and may be in a shape which is bent at plural spots.

Nickel plating is applied to the entire contact 12. Tin plating suitable for each section is then selectively applied to the contact section 12b and the connecting section 12e. For example, a bright tin-plated layer 12f, which is less vulnerable at the time of insertion and extraction with respect to the mating female contact and capable of suppressing the insertion resistance at the time of insertion to small resistance, is formed on the contact section 12b, and a semi-bright tin-plated layer 12g capable of obtaining favorable solderability is formed on the connecting section 12e. It should be understood that the tin plating mentioned here includes plating by a tin alloy such as a tin-copper alloy, a tin-bismuth alloy or the like, which does not include lead, as well as plating by pure tin.

Figure 2:
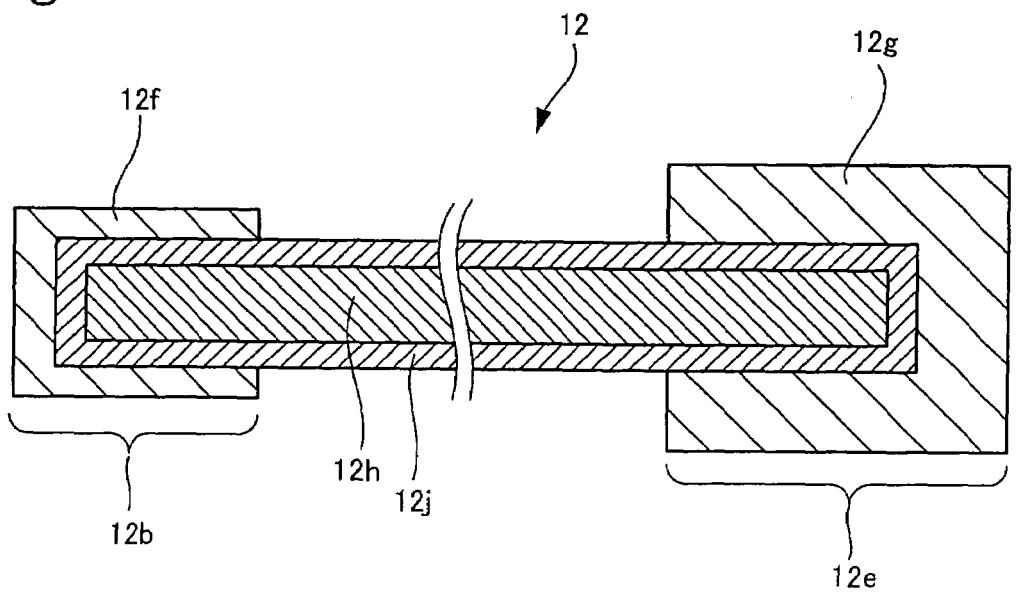
FIG. 2 is a sectional view schematically showing a plated layer of a contact shown in FIG. 1.

FIG. 2 is a sectional view schematically showing the plated layers of the contact 12 shown in FIG. 1. The contact 12 has a structure in which a nickel-plated layer 12j is formed on an entire surface of a base material 12h of a copper alloy including zinc. As described above, the bright tin-plated layer 12f is formed on the contact section 12b, and the semi-bright tin-plated layer 12g is formed on the connecting section 12e. The thickness of the semi-bright tin-plated layer 12g of the connecting section 12e is larger as compared with the thickness of the bright tin-plated layer 12f of the contact section 12b. As a result, the time before the alloy of zinc and tin which lowers solderability appears on the semi-bright tin-plated layer 12g after the semi-bright tin-plated layer 12g is formed on the connecting section 12e is increased. Therefore, favorable solderability of the connecting section 12b is maintained for a longer time in this embodiment.

Further, in this embodiment, tin plating is not applied to the bent section 12d where internal stress remains and has the possibility of creating a whisker which causes a problem of electrical short circuit between the adjacent contacts when tin plating is applied. Therefore, according to the electrical connector 12 of this embodiment, occurrence of a whisker can be prevented.

In the above description, composition of tin used for plating is not especially referred to, but the tin may be a tin alloy which does not include lead, such as, for example, a tin-copper alloy and a tin-bismuth alloy other than pure tin.

In the above description, the insulating housing 11 fixed by the mounting section is described as an example of the housing described in the present invention, but the present invention is not limited to this, and the housing of the present invention may be the one having a fixture such as a plate-shaped fitting (retention leg), for example.

Advantageously, in the electrical connector of the present invention, the middle portion having the possibility of occurrence of whisker in the terminal is excluded from the range of tin plating, and therefore, occurrence of a whisker can be prevented. Since the connecting section has a thicker tin-plated layer than the contact section, favorable solderability of the connecting section can be maintained for a long term.

Furthermore in an embodiment of the inventive electrical connector, the contact section has a bright tin-plated layer, and friction occurring at the time of fitting of the contact section of the terminal and the mating contact is small. Therefore, the electrical connector can be easily inserted into the mating connector that is the connection target with a small force, and the contact section is less vulnerable at the time of insertion and extraction. Furthermore, the bright tin-plated layer has a smooth surface, and a relatively small exposed surface area, and therefore, it is resistant to oxidizing and excellent in weatherability. In an embodiment, the connecting section has a semi-bright (matte) tin-plated layer, and therefore, it provides favorable solderability when soldered to the circuit board.

What is claimed is:

1. An electrical connector comprising:
    terminals each having at one end a contact section which contacts a mating contact and having at the other end a connecting section which connects to a circuit board, and each further having a bent section in a middle portion between the contact section and the connecting section;
    an insulating housing which holds the plurality of terminals; and
    tin plating selectively applied to the contact section and the connecting section of the terminal which remain unbent, leaving the bent section in the middle portion unplated by tin, such that the connecting section has a thicker tin-plated layer than the contact section;
    wherein the terminal has a bright tin-plated layer on the contact section, and has a semi-bright tin-plated layer on the connecting section.

2. An electrical terminal comprising:
    a contact section located at a first end;
    a connecting section located at a second end opposite the first end;
    a middle portion located between the contact and connecting sections; the middle portion having an engaging portion extending from the contact section, an extended section extending from the engaging portion and a bent section located between the extended section and the connecting section such that the extended and connecting sections lie in different planes;
    a first tin plating being selectively applied to only the contact section; and
    a second tin plating being selectively applied to only the connecting section;
    wherein the first tin plating is a bright tin-plated layer; and
    wherein the second tin plating is a semi-bright tin-plated layer.

3. The electrical terminal according to claim 2, wherein the second tin plated layer is thicker than the first tin plated layer.

* * * * *